(12) United States Patent
Wu (10) Patent No.: US 7,334,919 B2
(45) Date of Patent: Feb. 26, 2008

(54) LED DEVICE AND THE MANUFACTURING METHOD THEREOF

(76) Inventor: Jeng-shyong Wu, No. 14, Alley 1, Lane 326, Shin-Pin Road, Hsinchu (TW)

( * ) Notice: Subject to any disclaimer, the term of this patent is extended or adjusted under 35 U.S.C. 154(b) by 299 days.

(21) Appl. No.: 10/712,725

(22) Filed: Nov. 13, 2003

(65) Prior Publication Data

US 2005/0105291 A1    May 19, 2005

(51) Int. Cl.
*H01R 33/00* (2006.01)
(52) U.S. Cl. .................. 362/267; 362/84; 362/310; 257/100; 438/127
(58) Field of Classification Search ........ 362/249–252, 362/257, 313, 362, 376, 659, 84, 310; 174/74 R, 174/77 A, 76, 77 R, 79, 255; 439/602; 257/99, 257/98; 438/126, 127
See application file for complete search history.

(56) References Cited

U.S. PATENT DOCUMENTS

| | | | | |
|---|---|---|---|---|
| 2,077,973 A * | 4/1937 | Wilson | .................. | 362/362 |
| 3,820,237 A * | 6/1974 | Effer D | .................. | 438/27 |
| 5,116,229 A * | 5/1992 | Savage, Jr. | .................. | 439/56 |
| 5,121,311 A * | 6/1992 | Cheselske | .................. | 362/249 |
| 5,584,122 A * | 12/1996 | Kato et al. | .................. | 29/872 |
| 5,957,564 A * | 9/1999 | Bruce et al. | .................. | 362/84 |
| 6,074,244 A * | 6/2000 | Crum et al. | .................. | 439/505 |
| 6,200,003 B1 * | 3/2001 | Tseng | .................. | 362/249 |
| 6,299,332 B1 * | 10/2001 | Huang | .................. | 362/363 |
| RE37,554 E * | 2/2002 | Brunner et al. | .................. | 438/116 |
| 6,669,515 B1 * | 12/2003 | Urban et al. | .................. | 439/797 |

* cited by examiner

Primary Examiner—Thomas M. Sember
(74) Attorney, Agent, or Firm—McGlew and Tuttle, P.C.

(57) ABSTRACT

Disclosed are a LED device and the manufacturing method thereof, the device comprises a LED, which is composed of a LED chip and bonded wires, both connected to a plurality of lead frames and enveloped by a lamp cap, wherein one end of the lead frames emerges from the lamp cap; the plurality of insulating lead wires consist of conductors in the center, and the conductor on one end of the lead wires is connected to said emerged lead frame. Moreover, the insulator of said insulating lead wires is bent to the back and extended sideward; a protective device firmly holds the LED, the electrical connecting portion and the bent insulator positioning portion so as to make the insulator not easily to be released and make the LED device become a safe device.

50 Claims, 10 Drawing Sheets

LED DEVICE AND THE MANUFACTURING METHOD THEREOF

BACKGROUND OF THE INVENTION

1. Field of the Invention

This invention relates to a LED device and the manufacturing method thereof, and particularly to a device that is not easily released and is thus safer.

2. Description of the Prior Art

In conventional LED devices such as the one disclosed in the U.S. Pat. No. 6,200,003B1, the light emitting diode is primarily inserted into the socket, which is then inserted into a case, and connected via two conducting plates so as to form a lighting structure that is capable of exhibiting lamp changes. However, such a structure may exhibit lighting effects only in a single construction. But on the other hand, when it is connected in series or in parallel, it is often subject to factors such as the fastening style of its case and socket and the connection of the connecting plates, thus making it inconvenient when it is connected in series. Moreover, it cannot achieve a perfect visual appearance and can easily be released.

In order to overcome the shortcomings inherent in the conventional LED devices described above, the present inventor has delved into this matter with long-time efforts and has come to the realization of the present invention.

SUMMARY OF THE INVENTION

Hence, it is an object of the present invention to provide a LED device and the manufacturing method thereof, and the overall safety can be enhanced through structures such as a LED, a LED chip, bonded wires, lead frames and an enveloped lamp cap.

The LED device and the manufacturing method thereof according to the present invention is an invention wherein the LED device diverges from its two sides via the insulating lead wires so as to make it even more compact when it is enveloped with the protective device. Moreover, it is easier to make the lead wires be connected in series and in parallel and to form any shapes and models.

The LED device and the manufacturing method thereof according to the present invention is an invention that can make manufacturing convenient.

A more complete understanding of these and other features and advantages of the patent invention will become apparent from a careful consideration of the following detailed description of certain embodiments illustrated in the accompanying drawings.

DETAILED DESCRIPTION OF THE PREFERRED EMBODIMENTS

Figure 1A:
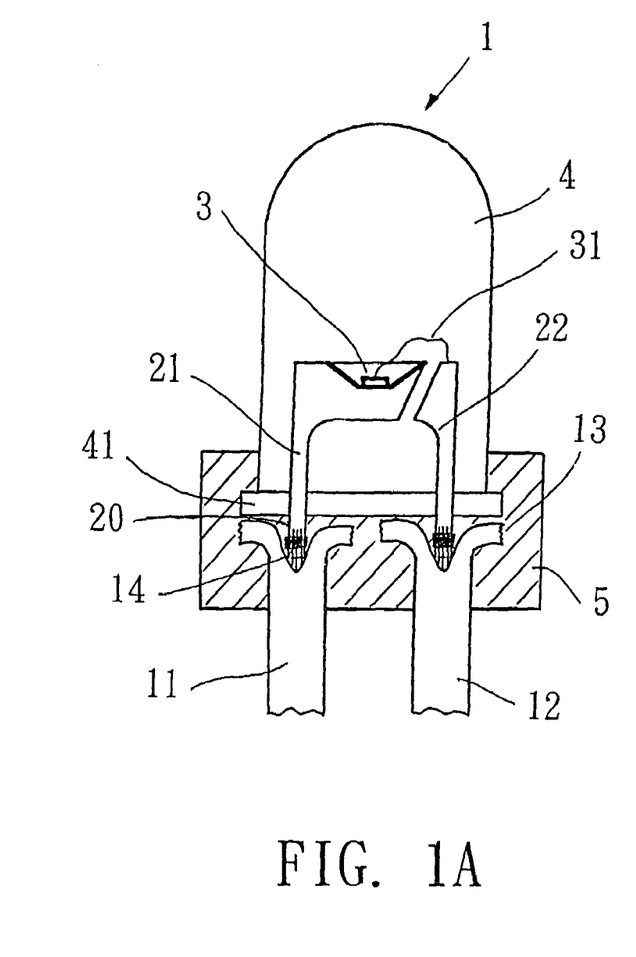
FIG. 1A and FIG. 1B are the first cross-sectional perspective views of the present invention.
Figure 10:
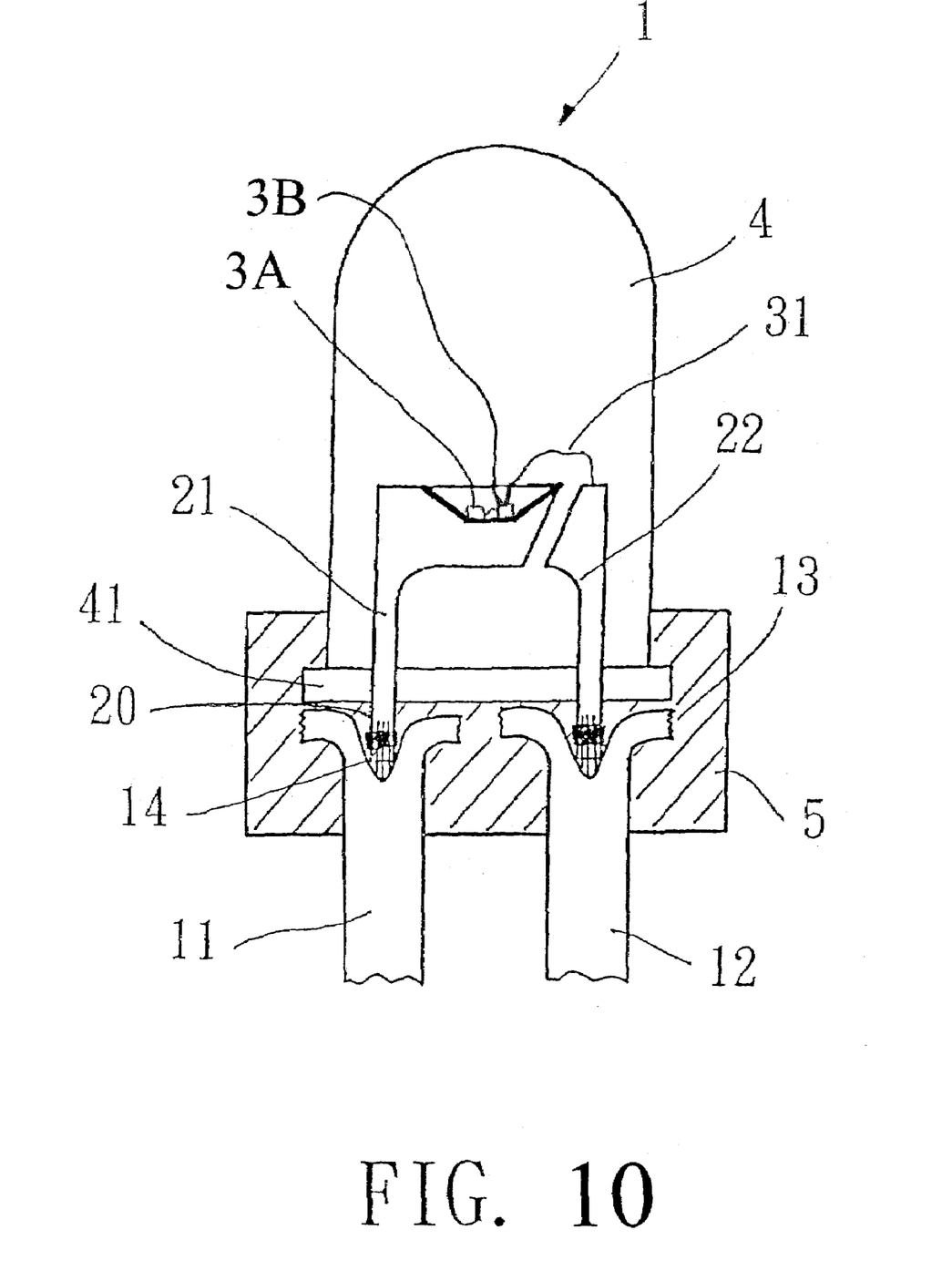
FIG. 10 is an embodiment showing a plurality of LED chips mounted on a base.

As shown in FIG. 1A, the LED device 1 in the present invention is composed of a LED light bulb, insulating lead wires and protective devices; two lead frames 21, 22 are installed on the LED light bulb, and the lower end of the two lead frames 21, 22 form an electrical connecting portion respectively, wherein a LED chip 3 installed on the top of one of the lead frame 21 and the LED chip 3 is then connected to the other lead frame 22 via bonded wires 31, and a lamp cap 4 is installed on the exterior so that the electrical connecting portion 20 on the lower end of the two lead frames 21 and 22 emerges from the lamp cap 4. In FIG. 10 a plurality of LED chips 3A and 3B are mounted on a base formed from lead frames 21, 22.

The insulating end on the top end of the insulating lead wires 11 and 12 is bent to the back and extended sideward so as to form an opening 13 in such a way that the conductor 14 in the center is connected to the electrical connecting portion 20 on the lower end of said lead frames 21 and 22.

The protective device 5 envelops the LED light bulb, the electrical connecting portion and the opening 13 formed by the backward bending and the sideward extension of the top of the insulating lead wires so as to achieve a safe device that is not easily released from the insulating lead wires and the electrical connecting portion.

Said lamp cap 4 can be made of plastics or transparent, semi-transparent or added with fluorescent substances; an insulating positioning bracket 41 is installed on the lower end of the lead frames 21 and 22 so as to firmly fix its position; the insulating lead wires 11, 12 connected on the lower end of the LED light bulb can be two or multiple in number, and parallel to one another or be in a predetermined angle (for example, at a right angle or in a straight line at 180°); the connection between the conductor S14 of the lead wires and the lead frames 21 and 22 call be welded or pressure bonded; the protective device 5 can also be transparent, semi-transparent or added with fluorescent substances, and can also envelop the entirety or parts of the LED light bulb.

Figure 1B:
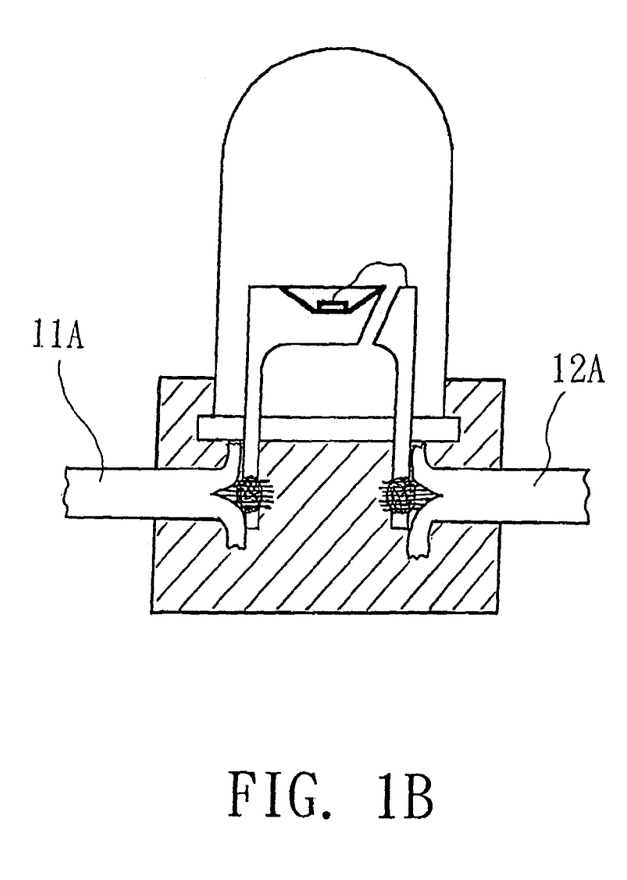

Referring to FIG. 1B, this is another embodiment of the present invention wherein the insulating lead wires 11A and 12A are connected in straight lines at 180° to the two sides.

Figure 2:
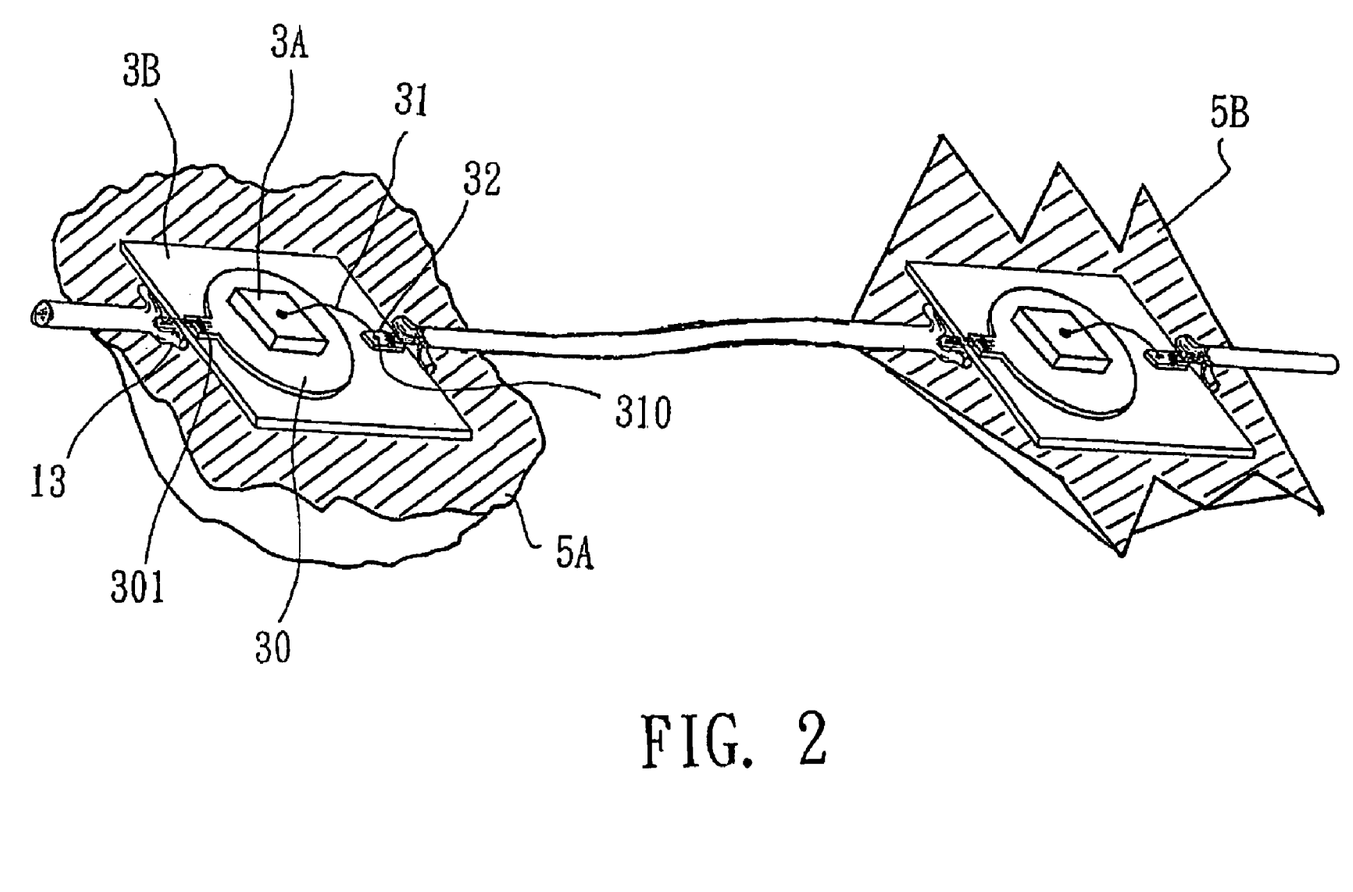
FIG. 2 is the second cross-sectional perspective view of the present invention.

Referring to FIG. 2, this is another embodiment of the present invention wherein the protective devices 5A and 5B as shown can be predetermined from different shapes, for example, regular or irregular shapes, flat or convex/concave so as to make the overall LED device be enveloped by plastics. A first electrode 30 and a second electrode 32 are mounted on the protective device 5A. The LED chip 3A is mounted on the first electrode 30. A bonded wire 31 connects the LED chip 3A to the electrode 32. The electrodes 30 and 32 have bonding sites 301 and 310 respectively.

Figure 3A:
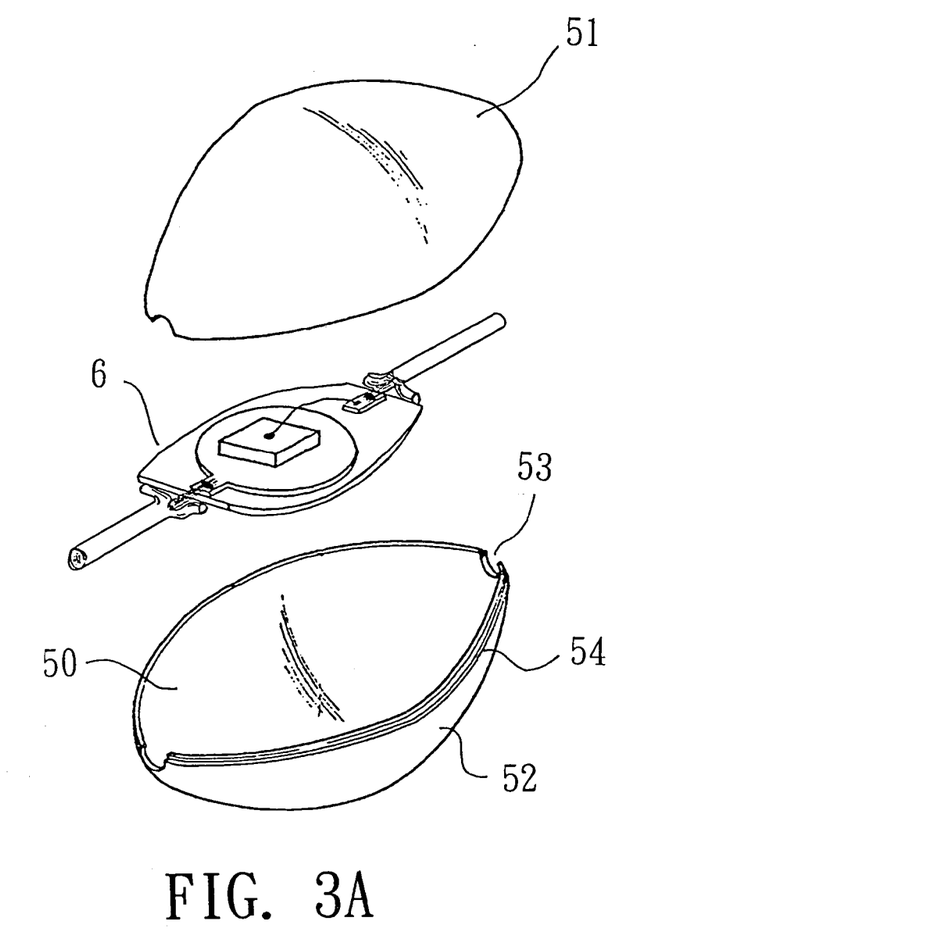
FIG. 3A and FIG. 3B are solid perspective views showing the decomposition of the present invention.
Figure 3B:
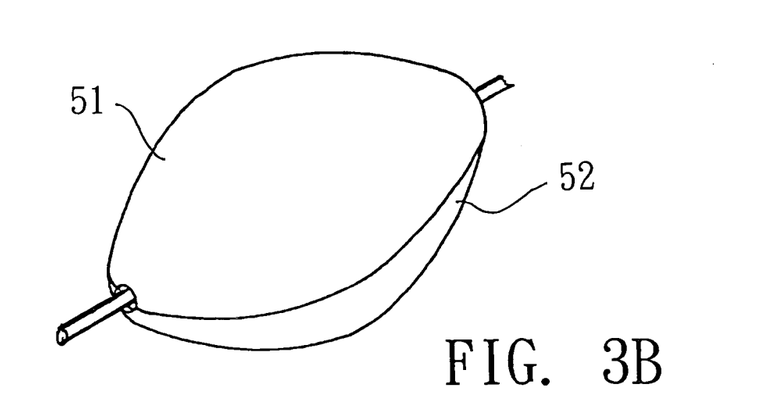
Figure 4:
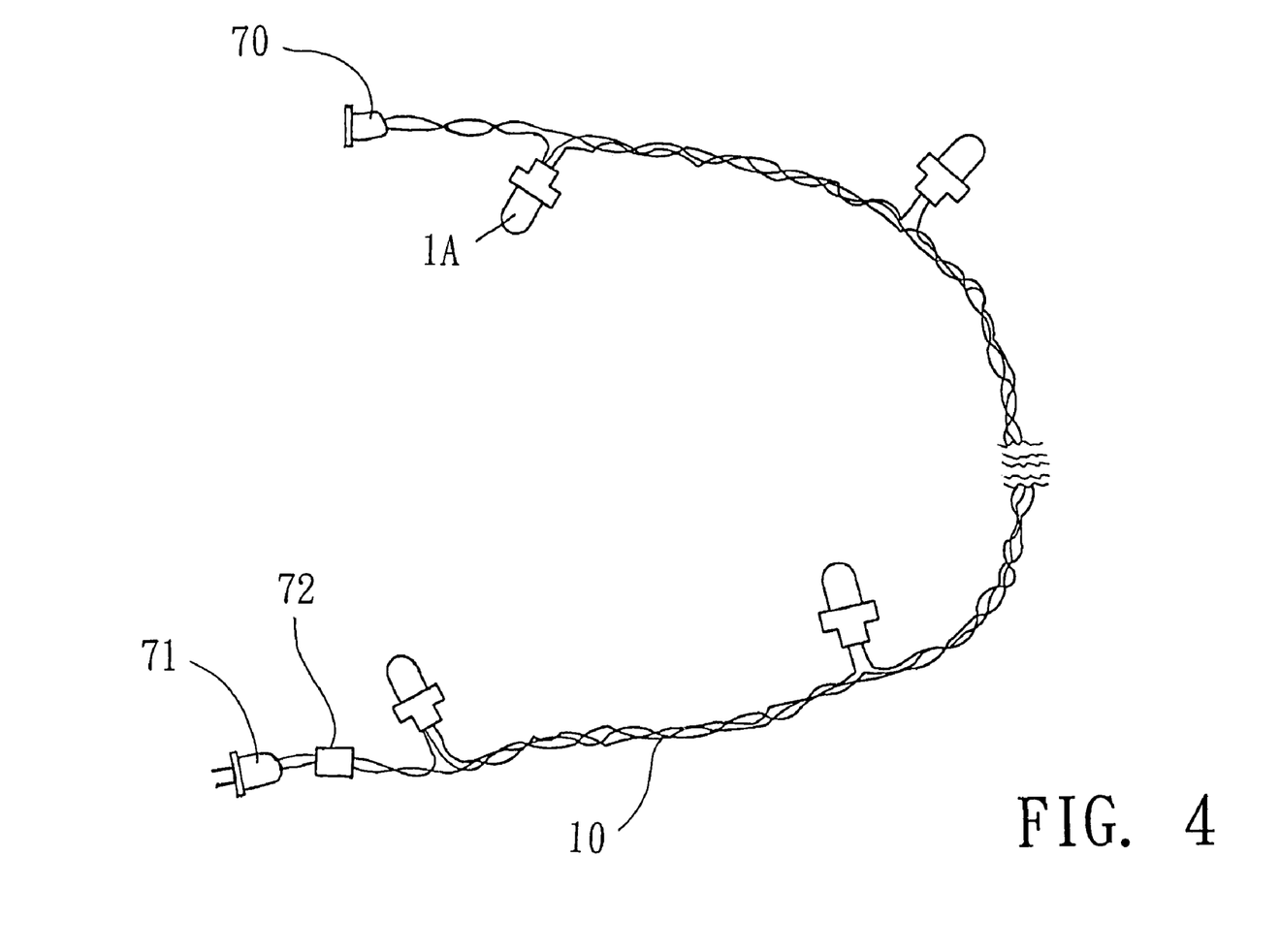
FIG. 4 is a perspective view showing the first embodiment of the present invention.

The LED device of the present invention as shown in FIG. 3A and FIG. 3B can be enveloped by two enveloping plates 51 and 52 on the top and the bottom like the protective devices as shown in FIG. 1A, 1B, and 2 so as to envelop the light emitting element 6 wherein the enveloping plates 51 and 52 are concave-shaped hollows with their hollow part 50 in the interior, and the two ends of the enveloping plates form an opening 53 respectively so as to install the insulating lead wires. Moreover, the bent part (that is the branching off part) of the insulation of the insulating lead wires tightly locked by the internal border locks and the lock 54 formed in the periphery of the connection are firmly fixed by joining or gluing so as to make them not easily become released. The embodiment of the LED device of the present invention as shown in FIG. 4 can be composed of a plurality of Led light emitting elements 1A, which consists of electrodes and a plurality of electrodes, which are connected by a plurality of insulating lead wires in such a way that the insulating ends on the top of insulating lead wires are bent to the back and extended sideward to form an opening so that the conductor in the center connects to the electrode on the chip base of different LED light emitting elements.

The protective device 5 envelops the entirety or parts of the light emitting elements, different electrical connecting portions and the opening formed by the backward bending and the sideward extension of the top of the insulating lead wires and can be connected in series, parallel or series-parallel in accordance with the directionality of the LED.

A power supply device is composed of a plug 71 and a socket 70, which connects to the lighting set so as to form predetermined functions, words, figures or shapes.

Said light emitting elements can be of the same or different functions and can be of the same or different colors.

Figure 5:
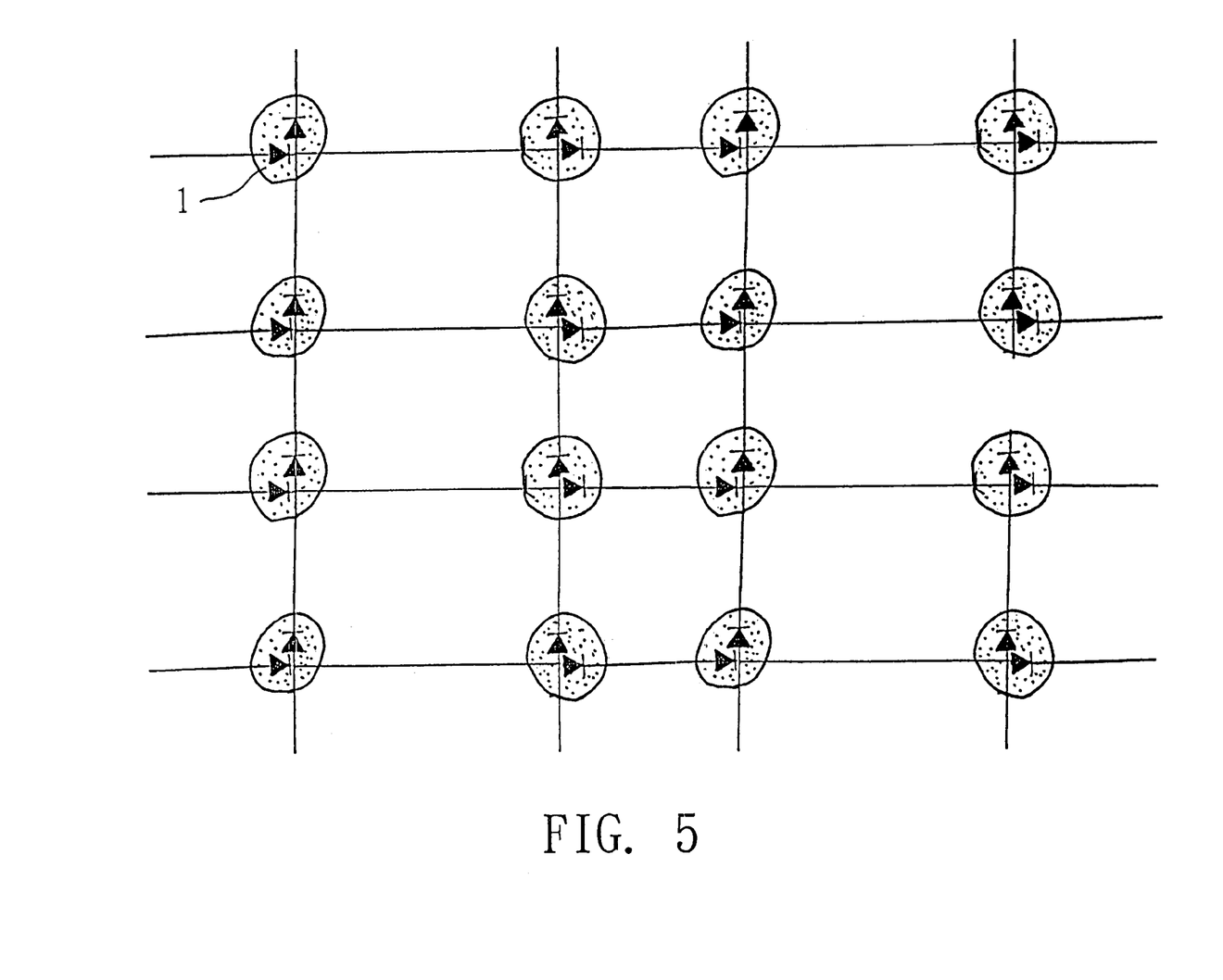
FIG. 5 illustrates the second embodiment of the present invention.

A plurality of LED light emitting elements can also be connected in strings as shown in the figure or connected in arrays as shown in FIG. 5. When they are connected in arrays, the LED should be made in different arrangements such as squares, rhombuses, or triangles and can also form into a network shape or a curtain type, or a two-plate shape.

Moreover, said power supply devices can connect to a function controller 72 so as to form predetermined functions.

Figure 6:
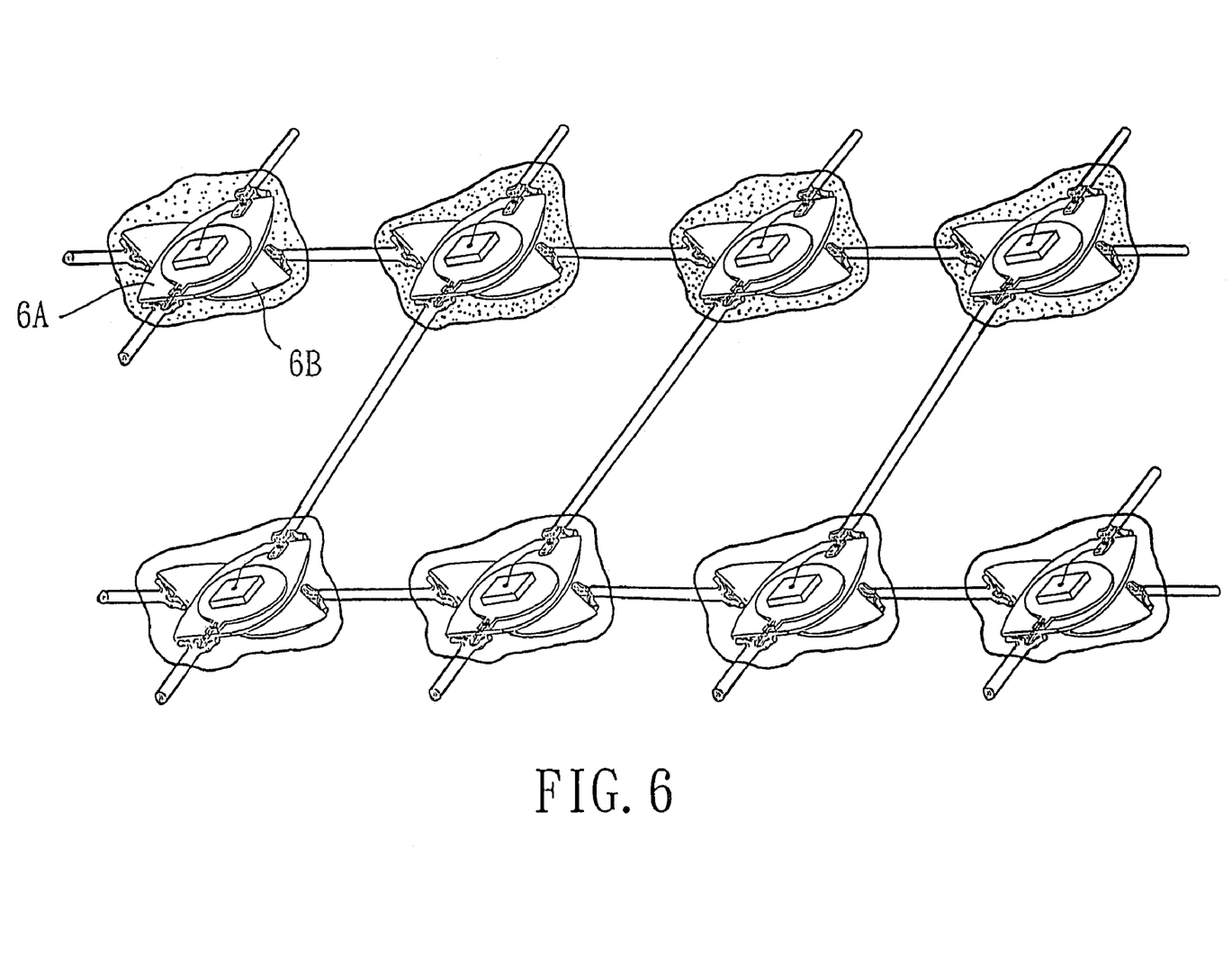
FIG. 6 is a perspective view showing the third embodiment of the present invention.
Figures 7A, 7B, 7C:
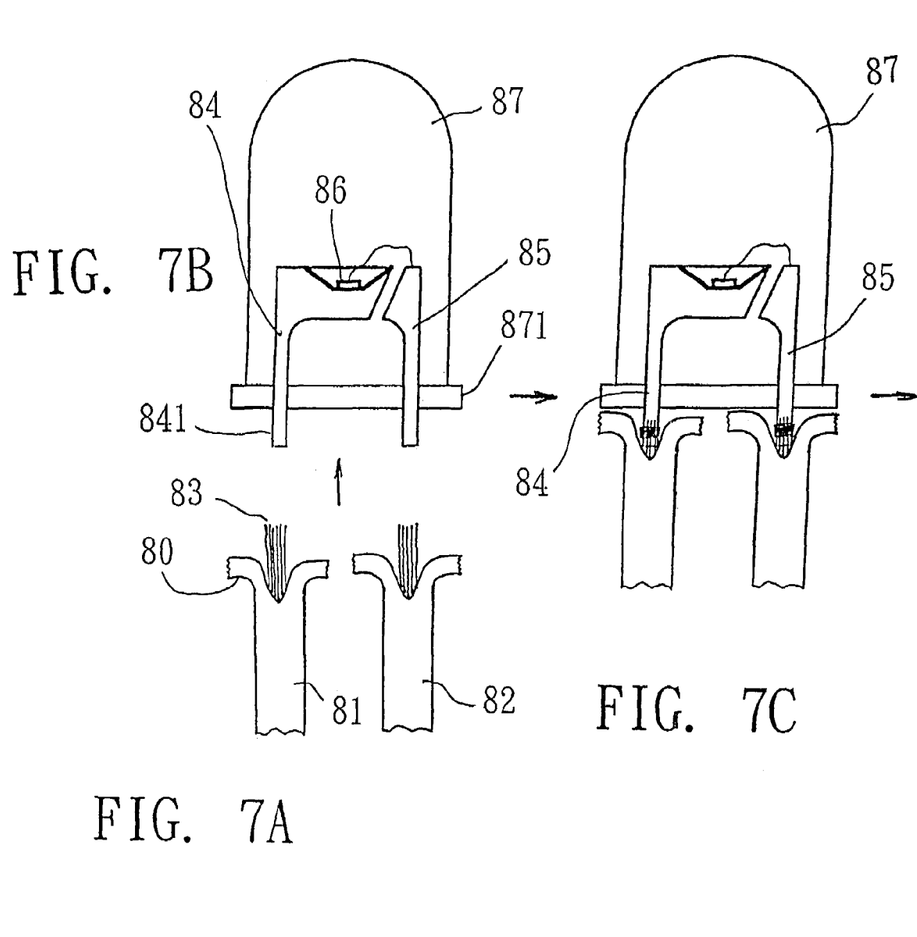
FIG. 7A~FIG. 7D is the first flowchart showing the first embodiment of the manufacturing of the present invention.
Figure 7D:
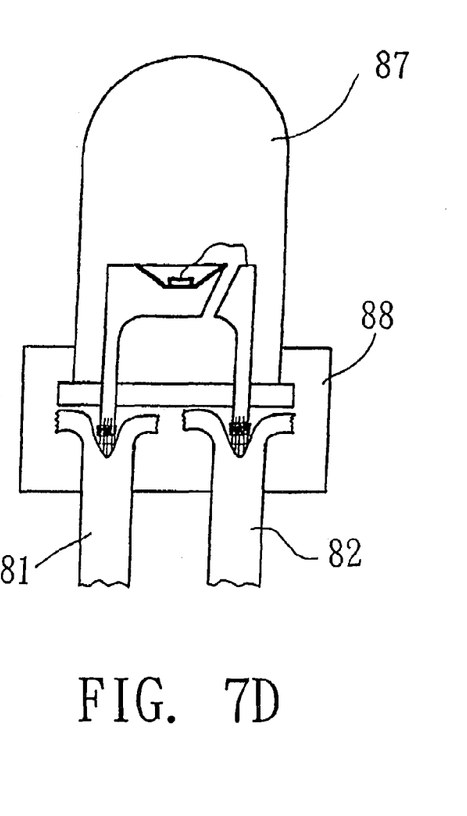

FIG. 6 shows different LED devices are connected in rhombuses, and the intersecting LED light emitting elements 6A and 6B in their interior connect to the different light emitting elements 6A and 6B via insulating lead wires. Regarding the manufacturing method of the LED device of the present invention, the LED device consists of the LED light bulb, lead frames, insulating lead wires and protective devices, and the steps for their manufacturing are as follows:

First separate the top of the insulating lead wires 81 and 82 into at least two plates so as to form a branching off part 80 so that the conductor 83 (as shown in FIG. 7A) is exposed; properly make two lead frames 84, 85, and an electrical connecting portion 841 is formed on the lower end so that a LED chip 86 is installed on the top of one of the lead frames 84, and the lamp cap 87 is then installed on the exterior, and the lower end of the lamp cap forms a flange 871 (as shown in FIG. 7B); the emerged conductor 83 and the lead frames 84, 85 are electrically connected to the electrical connecting portion 841 and the lead wires (as shown in FIG. 7C); a protective device 88 envelops the lower end of the lamp cap and the electrical connecting portion and is firmly fixed by lead wires 81 and 82 (as shown in FIG. 7D). The protective device can be made by plastics or enveloped from multiple combinations.

Figure 8A:
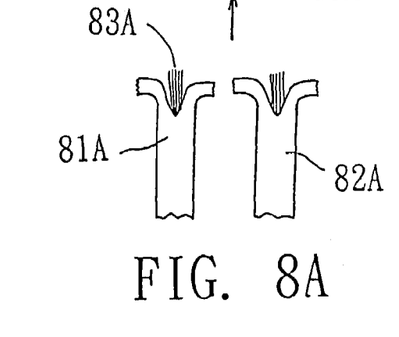
FIG. 8A~FIG. 8F is the second flowchart showing the second embodiment of the manufacturing of the present invention.
Figure 8B:
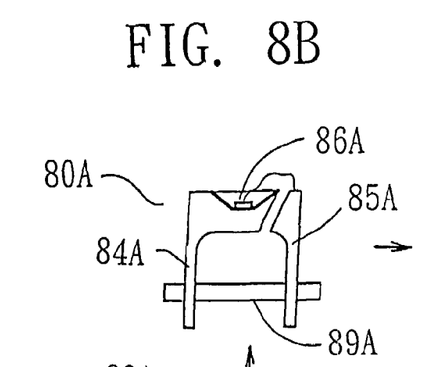
Figure 8C:
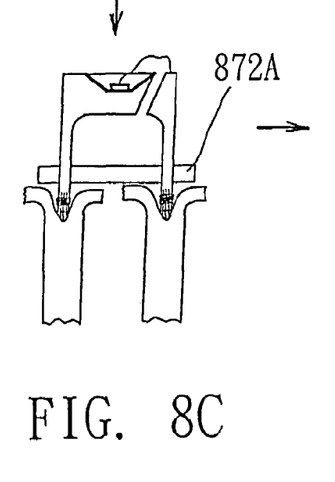
Figure 8D:
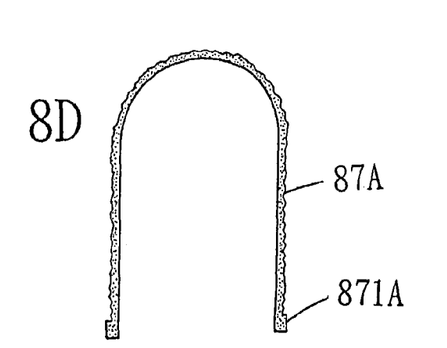
Figure 8E:
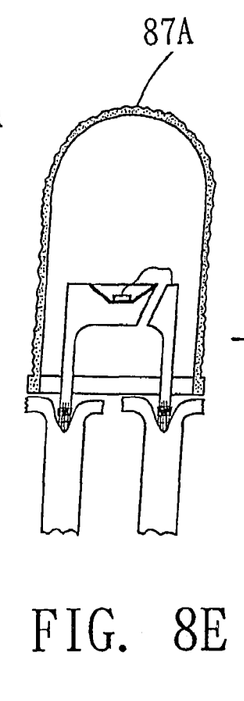
Figure 8F:
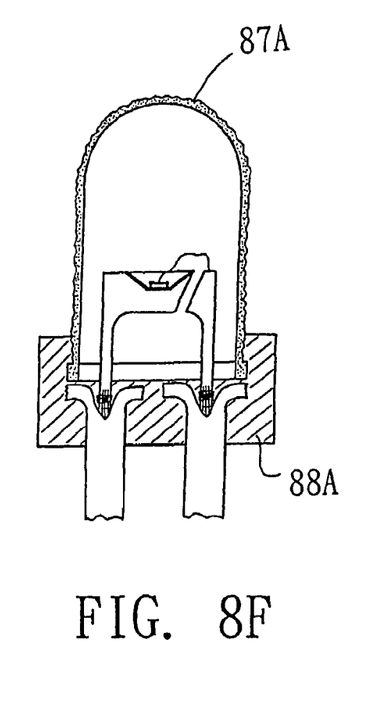

For another manufacturing method, the conductor 83 emerges from the opening at the top of the insulating lead wires 81 A and 82A (as shown in Fig. 8A). Moreover, properly make the LED light emitting element 80A, on which lead frames 84 and 85 are installed, and an insulating positioning bracket is installed on the LED light emitting elements 84A and 85A, wherein a LED chip 86A is installed on one of the lead frames 84A, and connected to another lead frame 85A via bonded wires (as shown in FIG. 8B); the emerged conductor 83A is electrically connected to the lead frames 84A and 85A (as shown in FIG. 8O). Then the insulating positioning bracket 872A with the lead frames 84A and 85A are inserted into the lamp cap 87A as shown in FIG. 8D, and coupled with the flange 871A on the lower end of the enveloping plates and the insulating positioning bracket 872A of the lead frame, and finally enveloped and positioned by the protective device 88A (as shown in FIG. 8F.)

Figure 9:
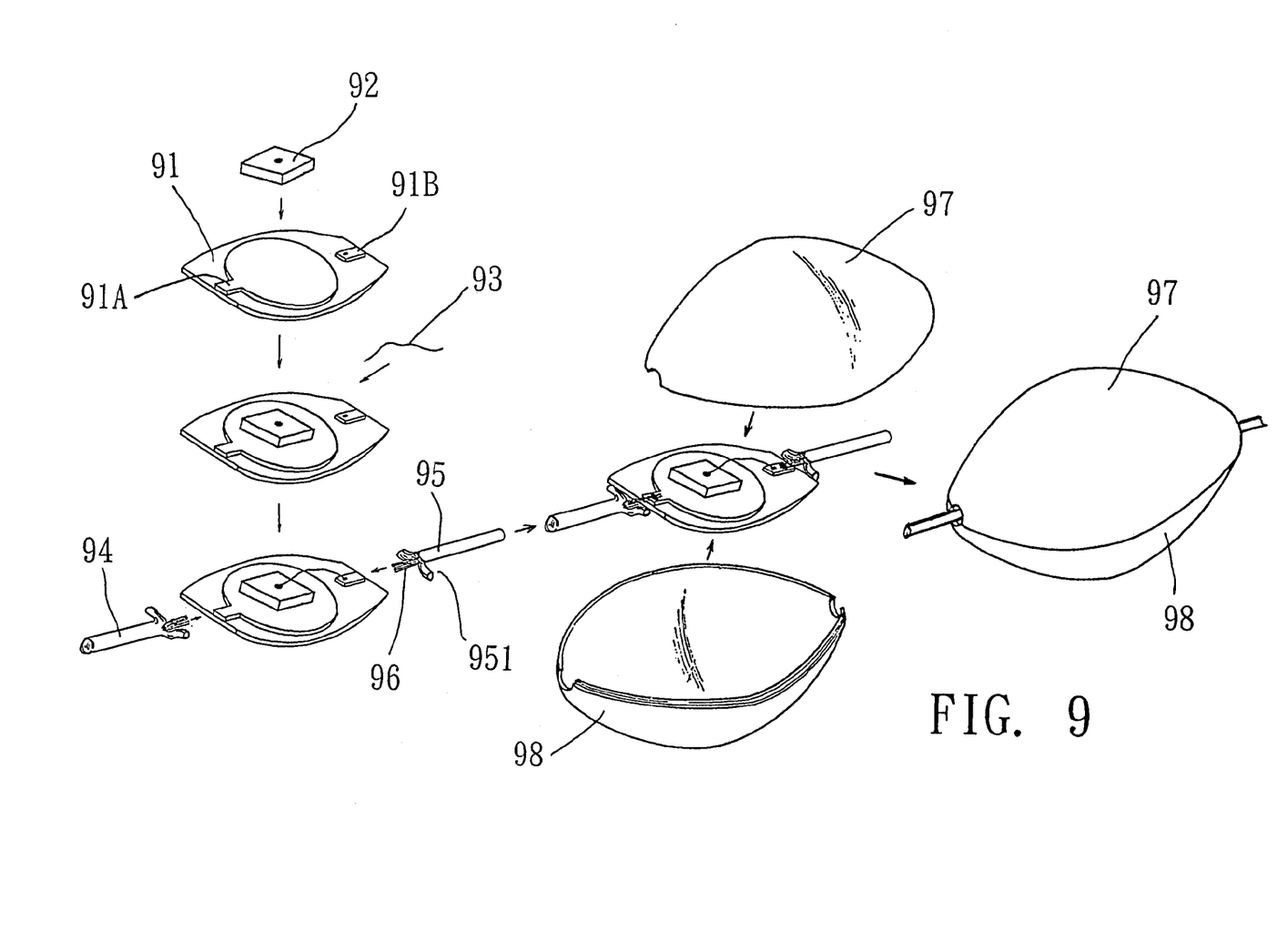
FIG. 9 is the third flowchart showing the third embodiment of the manufacturing of the present invention.

For another manufacturing method, as shown in FIG. 9, a LED chip base 91 is installed, and the first electrode 91A and the second electrode 91B are installed on the LED chip base wherein a LED chip 92 is installed on the first electrode 91A. After the LED chip 92 has been installed on the first electrode 91A, then the LED chip 92 is electrically connected to the second electrode 91B via bonded wire 93. After the overall structure has been assembled, insulating lead wires 94 and 95 are installed on the first electrode 91A and the second electrode 91B respectively, and then the front end of the insulating lead wires 94 and 95 branch off to form an opening 951 so as to expose the conductor 96; then the respective emerged conductors 96 are electrically connected to the first electrode 91A and the second electrode 91B, and then enveloped by the enveloping plates 97 and 98 in the top and the bottom in the hollow in the interior so as to form an overall structure. It can also be enveloped and fixed by the protective device of plastic materials.

From the above, the LED device and the manufacturing method of the present invention can definitely be safer and effective when it is used, and such effects can definitely improve the weaknesses inherent in the conventional LEDs. Hence, the present invention is deemed to comply with conditions for approvable patents stipulated by the Patent Law. We sincerely hope that the present invention can be allowed for registration.

For another manufacturing method, as shown in FIG. 9, a LED chip base 91 is installed, and the first electrode 91A and the second electrode 91B are installed on the LED chip base wherein a LED chip 92 is installed on the first electrode 91A. After the LED chip 92 has been installed on the first electrode 91A, then the LED chip 92 is electrically connected to the second electrode 91B via bonded wires. After the overall structure has been assembled, an insulating lead wire 94 and 95 is installed on the first electrode 91A and the second electrode 91B respectively and then the front end of the insulating lead wires 94 and 95 branches off to form an opening 951 so as to expose the conductor 96; then the emerged conductor 96 is electrically connected to the first electrode 91A and the second electrode 91B, and then enveloped by the enveloping plates 97 and 98 in the top and the bottom in the hollow in the interior so as to form an overall structure. It can also be enveloped and fixed by the protective device of plastic materials.

From the above, the LED device and the manufacturing method of the present invention can definitely be safer and effective when it is used, and such effects can definitely improve the weaknesses inherent in the conventional LEDs. Moreover, the invention has not yet been publicly disclosed and used. Hence, the present invention is deemed to comply with conditions for approvable patents stipulated by Patent Law. We sincerely hope that the present invention can be allowed for registration.

Although the invention has been described in terms of preferred embodiments, it is apparent that numerous variations and modifications may be made without departing from the true spirit and scope thereof, as set forth in the following claims.

What is claimed is:

1. A LED device comprises:
   a LED light bulb including a LED chip, bonded wires, both connected to a plurality of lead frames and enveloped by a lamp cap, and one end of each of the lead frames emerges from the lamp cap;
   a plurality of insulating lead wires each having a conductor in a center;
   the conductor on one end of each said lead wire is connected to one of said emerged lead frames by an electrical connecting portion, and an insulator of each said insulating lead wire is bent back and extended sideward away from said conductor;
   a protective device for directly holding said LED light bulb, the electrical connecting portion and a bent insulator positioning portion to make said insulator not easily be released such that this becomes a safe device.

2. The LED device as claimed in claim 1, wherein said lamp cap consists of flanges so as to connect and position to said protective device.

3. The LED device as claimed in claim 1, wherein said lamp cap is made of plastics.

4. The LED device as claimed in claim 1, wherein said lamp cap is transparent, semi-transparent, or added with fluorescent materials.

5. The LED device as claimed in claim 1, wherein an insulating positioning bracket is installed on said plurality of lead frames so as to firmly fix said lead frames.

6. The LED device as claimed in claim 1, wherein said plurality of insulating lead wires and said LED light bulb are connected together in a form that said plurality of insulating lead wires are parallel.

7. The LED device as claimed in claim 1, wherein said plurality of insulating lead wires and said LED light bulb are connected together in a predetermined angle.

8. The LED device as claimed in claim 7, wherein said predetermined angle is a right angle or a 180 degree angle to make said insulating lead wires form into straight lines.

9. The LED device as claimed in claim 1, wherein said conductor and said lead frames are electrically connected by welding or pressure bonding.

10. The LED device as claimed in claim 1, wherein said protective device is transparent, semi-transparent or added with fluorescent materials.

11. The LED device as claimed in claim 1, wherein said protective device holds the entirety or parts of said LED light bulb.

12. The LED device as claimed in claim 1, wherein: said LED light bulb, said plurality of insulating lead wires, and said protective device are enveloped by plastics.

13. The LED device as claimed in claim 1, wherein said protective device is enveloped by a plurality of enveloping plates so as to form a hollow construction.

14. The LED device as claimed in claim 13, wherein openings are reserved on said plurality of enveloping plates so as to install said insulating lead wires.

15. The LED device as claimed in claim 13, wherein said plurality of enveloping plates are used with an internal border to tightly lock the bent part of said insulator so as not to be easily released.

16. The LED device as claimed in claim 13, wherein said plurality of enveloping plates are firmly fixed by joining or gluing.

17. A LED device comprising:
   light emitting elements including at least two predetermined electrodes on an LED chip base, and at least a LED chip is fixed on said LED chip base and connected to one of said electrodes, and two ends of bonded wires are connected to said LED chip and another of said electrodes;
   a plurality of insulating lead wires having conductors in a center, and one end of said lead wires is connected to said electrode on the chip base by an electrical connecting portion, and moreover, an insulating end of said insulating lead wires are bent back and extended sideward away from said conductor; and
   a protective device for directly holding said light emitting elements, electrical connecting, portion and a bent insulator positioning portion so as to make them not easily be released and become a safe device.

18. The LED device as claimed in claim 17, wherein a plurality of LED chips are installed on said base in the same or different directions.

19. The LED device as claimed in claim 17, wherein a plurality of insulating lead wires and LED light bulb are connected together in a form that a plurality of insulating lead wires are parallel.

20. The LED device as claimed in claim 17, wherein a plurality of insulating lead wires and LED light bulb are connected together in a predetermined angle.

21. The LED device as claimed in claim 20 wherein said predetermined angle is a right angle or a 180 degree angle to make said insulating wires in a straight line.

22. The LED device as claimed in claim 17, wherein said conductors and said electrodes are electrically connected by welding or pressure bonding.

23. The LED device as claimed in claim 17 wherein said protective device is transparent, semi-transparent, or added with fluorescent materials.

24. The LED device as claimed in claim 17, wherein: said light emitting elements, said plurality of insulating lead wires, and said protective device are enveloped by plastics.

25. The LED device as claimed in claim 17, wherein said protective device is enveloped by a plurality of enveloping plates to form a hollow construction.

26. The LED device as claimed in claim 17 wherein openings are reserved on a plurality of enveloping plates so as to install insulating lead wires.

27. The LED device as claimed in claim 17 wherein a plurality of enveloping plates are used with an internal border to tightly lock the bent part of said insulator so as not to be easily released.

28. The LED device as claimed in claim 17, wherein a plurality of enveloping plates are firmly fixed by joining or gluing.

29. A method for manufacturing a LED device comprising a LED light bulb and a plurality of emerged lead frames; insulating lead wires with conductors in a center and a protective device, the method includes the following steps:
   separating an end of said insulating lead wires into at least two plates of insulators so as to expose said conductor;
   electrically connecting said emerged conductor to said lead frames of said LED light bulb to form an electrical connecting portion, and bending said insulators of said lead wires back and extended sideward away from said conductor;
   holding said LED light bulb, electrical connecting portion and an insulating part of said insulating lead wires by said protective device.

30. The LED device as claimed in claim 29, wherein said protective device is made from plastics.

31. The LED device as claimed in claim 29 wherein said protective device is formed by a plurality of enveloping plates.

32. A method for manufacturing a LED device comprising a LED chip base, which includes at least two predetermined electrodes; at least a LED chip, bonded wires; insulating lead wires having conductors in a center; and a protective device, the method includes the following steps:
- fixing said LED chip on said LED chip base and electrically connecting to one of said electrodes;
- electrically connecting two ends of bonded wires respectively to said LED chip and another of the electrodes;
- separating an end of said insulating lead wires so as to expose said conductor in its center;
- electrically connecting said exposed conductor to said LED light bulb to form and electrical connecting portion, and bending an insulator of said insulating lead wires back and extended sideward away from said conductor;
- directly holding said LED chip and its base, bonded wires, electrical connecting portion and said bent insulator by said protective device.

33. The LED device as claimed in claim 32, wherein said protective device is made from plastics.

34. A lighting device comprising:
- a light bulb including a plurality of lead frames and a lamp cap connected to the lead frames, one end of each of said lead frames extending from the lamp cap;
- a plurality of insulating lead wires, each of said lead wires having a conductor surrounded by insulation, said insulation at ends of said lead wires being bent away from said conductor and extending radially outward from said conductor, each of said conductors being connected to one of said lead frames at a connecting portion;
- a protective device directly connected to said light bulb, said connecting portion and said insulation at said ends of said lead wires.

35. A device in accordance with claim 34, wherein:
said lightbulb includes an LED chip, and bonded wires electrically connecting said LED chip to said plurality of lead frames.

36. A device in accordance with claim 35, wherein:
said LED chip is arranged inside said lamp cap;
said protective device is enveloped around said lightbulb, said ends of said lead wires, said ends of said lead frames and said connecting portion;
said protective device is directly connected to said lightbulb only at a base of said lightbulb;
said protective device is directly connected to said lamp cap.

37. A device in accordance with claim 34, wherein:
said protective device is enveloped around said lightbulb, said ends of said lead wires, said ends of said lead frames and said connecting portion.

38. A device in accordance with claim 34, wherein:
said protective device is directly connected to said lightbulb only at a base of said lightbulb.

39. A device in accordance with claim 34, wherein:
said protective device is directly connected to said lamp cap.

40. A device in accordance with claim 34, wherein:
said light bulb has a primary light emitting direction, said plurality of insulating lead wires extend from said lightbulb in a direction substantially parallel to said primary light emitting direction.

41. A device in accordance with claim 34, wherein:
said light bulb has a primary light emitting direction, said plurality of insulating lead wires extend from said lightbulb in a direction substantially perpendicular to said primary light emitting direction.

42. A device in accordance with claim 34, wherein:
said lightbulb, said plurality of insulating lead wires and said protective device form a first light emitting element;
a second light emitting element is provided and is similar to said first light emitting element, one of said plurality of insulating lead wires of said second light element is directly connected to one of said plurality of insulating lead wires of said first light element.

43. A device in accordance with claim 42, wherein:
a plurality of light emitting elements is provided similar to, and connected similarly as, said first and second light emitting elements.

44. The device as claimed in claim 43, wherein said plurality of light emitting elements are connected in strings.

45. The device as claimed in claim 43, wherein said plurality of light emitting elements are connected in arrays.

46. The device as claimed in claim 45, wherein said arrays are made in different arrangements including squares, rhombuses, or triangles.

47. The device as claimed in claim 46, wherein said arrays can also be formed into a network shape or a curtain type.

48. The device as claimed in claim 45, wherein said arrays can also be formed into a network shape or a curtain type.

49. The device as claimed in claim 45, wherein said arrays are made in a two-plate shape.

50. The device as claimed in claim 43, further comprising: a function controller so as to form predetermined functions for lighting said plurality of light emitting elements.

* * * * *